United States Patent
Dang et al.

(10) Patent No.: US 8,564,365 B2
(45) Date of Patent: Oct. 22, 2013

(54) WIDE INPUT BIT-RATE, POWER EFFICIENT PWM DECODER

(75) Inventors: Nam V. Dang, San Diego, CA (US); Terrence B. Remple, San Diego, CA (US); Zhiqin Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 33 days.

(21) Appl. No.: 13/469,261

(22) Filed: May 11, 2012

(65) Prior Publication Data

US 2013/0187708 A1 Jul. 25, 2013

Related U.S. Application Data

(60) Provisional application No. 61/588,786, filed on Jan. 20, 2012.

(51) Int. Cl.
*H03K 9/08* (2006.01)

(52) U.S. Cl.
USPC .......................... 329/312; 375/238

(58) Field of Classification Search
USPC .......................... 329/312; 375/238
See application file for complete search history.

(56) References Cited

U.S. PATENT DOCUMENTS

| | | | |
|---|---|---|---|
| 4,617,677 A * | 10/1986 | Chiba | ........................... 375/340 |
| 5,621,758 A | 4/1997 | Suzuki et al. | |
| 5,905,406 A | 5/1999 | Sugden et al. | |
| 7,733,189 B1 * | 6/2010 | Bennett | ........................... 331/64 |
| 7,995,027 B2 * | 8/2011 | Hong | ........................... 345/102 |
| 2008/0157894 A1 | 7/2008 | Hariton et al. | |
| 2009/0284295 A1 | 11/2009 | Diewald et al. | |
| 2010/0127789 A1 | 5/2010 | Kenly et al. | |
| 2010/0169045 A1 | 7/2010 | Shin et al. | |
| 2010/0289547 A1 | 11/2010 | Crofts | |

FOREIGN PATENT DOCUMENTS

| | | |
|---|---|---|
| EP | 0603851 A2 | 6/1994 |
| EP | 0610592 A2 | 8/1994 |

OTHER PUBLICATIONS

International Search Report and Written Opinion—PCT/US2013/022338—ISA/EPO—May 10, 2013.

* cited by examiner

*Primary Examiner* — Joseph Chang
(74) *Attorney, Agent, or Firm* — Nicholas J. Pauley; Sam Talpalatsky; Joseph Agusta

(57) ABSTRACT

A pulse width modulated (PWM) signal is received and, over a time interval of the PWM signal, a first count is incremented when the PWM signal is at a first level, and a second count is incremented when the PWM signal is at a second level. At the end of time interval the first count is compared to the second count and, based on the comparison, a decoded bit is generated. Optionally, incrementing the first count is by enabling a first oscillator that increments a first counter, and incrementing the second count is by enabling a second oscillator that increments a second counter.

23 Claims, 7 Drawing Sheets

WIDE INPUT BIT-RATE, POWER EFFICIENT PWM DECODER

CLAIM OF PRIORITY UNDER 35 U.S.C. §119

The present Application for Patent claims priority to Provisional Application No. 61/588,786 entitled "All Digital, Wide Input Bit-Rate, Power Efficient MPHY PWM Decoder," filed Jan. 20, 2012, and assigned to the assignee hereof and hereby expressly incorporated by reference herein.

FIELD OF DISCLOSURE

The disclosure relates to decoding communication signals, in particular to decoding pulse-width modulated signals.

BACKGROUND

Pulse Width Modulation (PWM) is a known modulation scheme in which a pulse width (PW) is modulated between two values, one for "0" and the other for "1." The PW can also be referred to as the "duty-cycle." The pulse-to-pulse period of the PWM signal can also carry clock information. FIG. 1 shows a timing diagram of one example PWM bit stream and an example PWM waveform for carrying binary values.

PWM signaling can present particular technical difficulties, for example phase stability in the receiver.

SUMMARY

Exemplary embodiments provide, among other features, digital oversampling techniques with a self-generated clock, synchronized with an incoming data stream, and a novel signal-enabled oscillator pulse signal digitizer, and digital PWM decoder that provides, among other benefits, accurate, digital decoding of PWM signals over a wide range of bit rates.

In an embodiment, a method for decoding a pulse width modulated signal can include, over a time interval, incrementing a first count when the pulse width modulated signal is at a first level, incrementing a second count when the pulse width modulated signal is at a second level and, at an end of the time interval, comparing the first count to the second count and generating, based on the comparing, a decoded bit.

In methods according to one embodiment, incrementing the first count can be based on a first incrementing clock, and incrementing the second count can be based on a second incrementing clock.

Methods according to one embodiment can, in an aspect, include enabling a first incrementing clock to a first counter when the pulse width modulated signal is at the first level and enabling a second incrementing clock to a second counter when the pulse width modulated signal is at the second level.

In an aspect, methods according to one embodiment can, in incrementing the first count, include changing a first oscillator from a non-oscillating state to an oscillating state in response to the PWM signal being at the first level, generating a first incrementing clock based on the first oscillator in the oscillating state, and incrementing a first counter based on the first incrementing clock.

In methods according to one embodiment, the oscillator can be a gated ring oscillator having a feedback gate and, in an aspect, changing the first oscillator from the non-oscillating state to the oscillating state can include coupling the pulse width modulated signal to an input of the feedback gate.

In methods according to one embodiment, the time interval can be a bit period of the pulse width modulated signal and, in various aspects, methods according to on or more embodiments can further include detecting a beginning of the bit period and, in response, resetting a first counter generating the first count and a second counter generating the second count.

In a further aspect, methods according to one or more embodiments can include detecting an end of the bit period and, in response, latching an output of the first counter and of the second counter. In another aspect, methods according to one or more embodiments can include, in response to detecting the end of the bit period, resetting the first counter and resetting the second counter.

In methods for decoding a pulse width modulated signal in accordance with one embodiment, the first oscillator can be a gated ring oscillator having a feedback gate. In a related aspect, changing the first oscillator from the non-oscillating state to the oscillating state can include coupling the pulse width modulated signal to an input of the feedback gate.

Methods for decoding a pulse width modulated signal in accordance with one embodiment can include setting an oscillating frequency of the first oscillator by switching the feedback gate from a first state to a second state and, in an aspect, the first state imparts a unit delay and the second state does not impart the unit delay.

One apparatus for decoding a pulse width modulated signal can, according to one embodiment, include a first ring oscillator configured to oscillate in response to a first state of the pulse width modulated signal, a second ring oscillator configured to oscillate in response to a second state of the pulse width modulated signal, a first counter coupled to the first ring oscillator, a second counter coupled to the second ring oscillator, and a comparator configured to compare the first counter to the second counter and output a resulting bit.

An apparatus for decoding a pulse width modulated signal can, according to one embodiment, include means for incrementing, over a time interval of the pulse width modulated signal, a first count when the pulse width modulated signal is at a first level, means for incrementing, over the time interval, a second count when the pulse width modulated signal is at a second level, and means for comparing the first count to the second count at the end of the time interval and generating, based on the comparing, a decoded bit.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Figure 1:
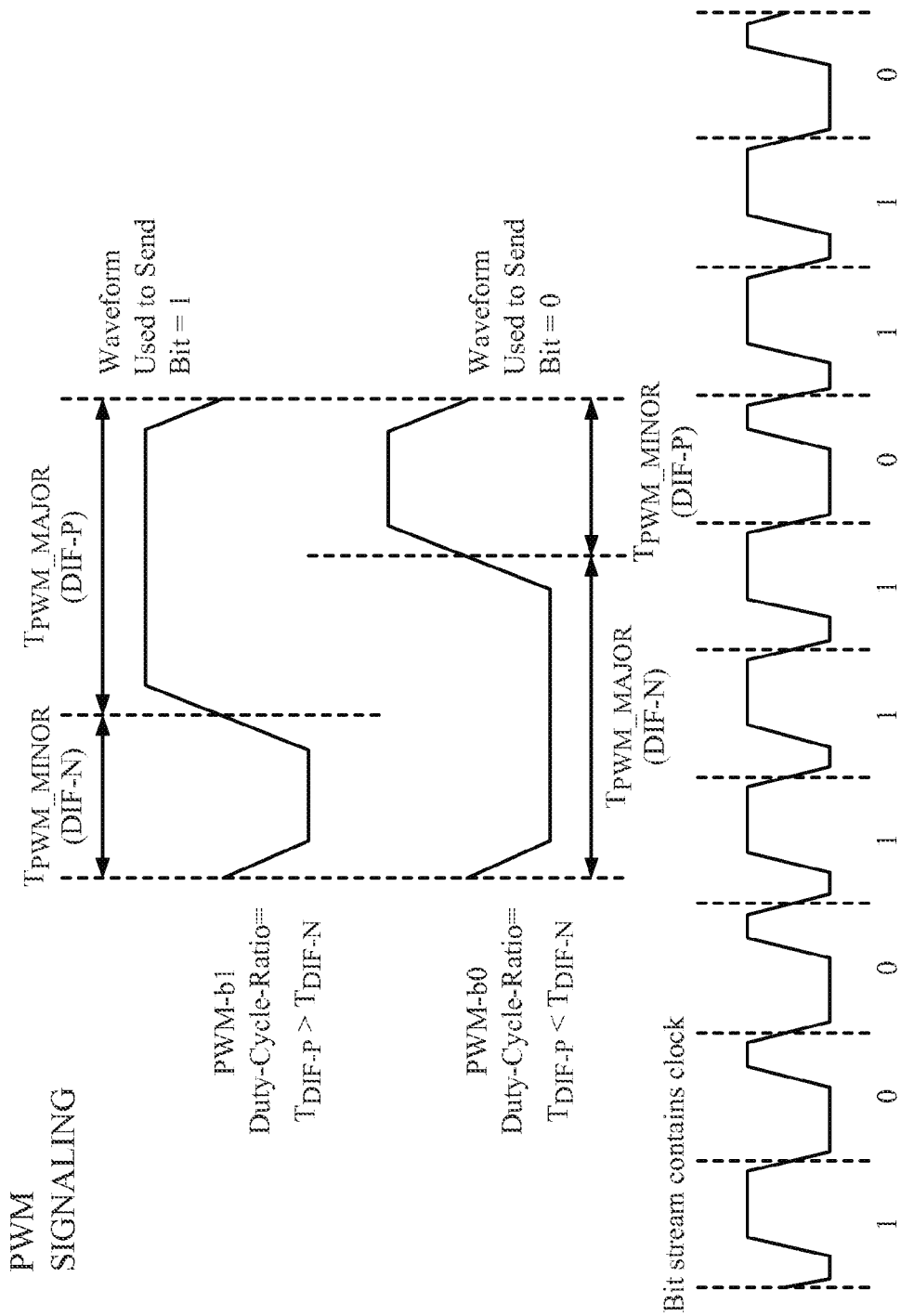
FIG. 1 shows a timing diagram of one example pulse width modulated (PWM) bit stream and waveform.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

According to one exemplary embodiment, a PWM signal is received, having successive bit intervals, each bit interval corresponding to one bit. Over each bit interval, the PWM signal can be at "high" level and at a "low" level. The ratio of the duration at the high level to the duration at the low level can be a binary value, one of the values representing a "0" and the other representing a "1."

According to one exemplary embodiment, two identical frequency oscillators can be configured with circuitry that enables oscillation of one in response to the "high" level of the PWM signal, and enables the other of the oscillators only in response to the "low" level of the PWM signal. In an aspect the oscillator enabled by the "high" level of the PWM signal can be referenced as the "high pulse level counting clock, and the oscillator that is enabled by the "low" level of the PWM signal will be referenced as the "low pulse level counting clock." In an aspect, a high pulse level counting means can be configured to receive the high level pulse counting clock, and a low pulse level counting means can be configured to receive the low pulse level counting clock. In a further aspect, each of the high pulse level counting means and the low pulse level counting means can be configured with a reset. In a related aspect, the reset can be aligned in phase with the start and end of bit periods of the received PWM signal. In another aspect, a comparison of the respective counts of the high pulse level counting means and low pulse level counting means can be provided, aligned with the end of the bit period and, based on the comparison, a decoded bit can be generated.

One example operation can assume a PWM signal is received, having a bit rate of FS bit per second and a clock at a rate FS is recovered from the PWM signal. The recovered clock can be phase adjusted to align with the time boundaries between successive bits in the PWM signal. Over one bit period, i.e., 1/FS, the PWM signal can have the following waveform: a "0" has a high level for 1/L of the bit period (L being, for example, an integer) and a low level for the remainder, i.e., (L-1)/L, a "1" has a high level for (L-1)/L of the bit period and a low level for the remainder, i.e., 1/L. As illustration, if L is 3, a "0" bit value can correspond to PWM signal high for ⅓ of the bit period (1/FS) and low for ⅔ of the bit period, and a "1" bit value can correspond to the PWM signal being high for ⅔ of the bit period and low for ⅓ of the bit period.

In one example, the PWM signal bit, regardless of being a "0" or a "1," can start with the same transition, i.e., low-to-high, or high-to-low transition, remain at the transitioned to state for a first fraction of the bit period, then transition to the other state for the remainder of the bit period. Using the same starting transition allows circuitry to detect a start of the bit interval, irrespective of the bit value. In an aspect, upon detection of the starting transition the high level pulse counting means and the low level pulse counting means can be reset, e.g., zeroed. Afterward, when the PWM signal is at the high level the high level pulse counting means is enabled, and the low level pulse counting means is disabled and, similarly, when the PWM signal is at the low level the low level pulse counting means is enabled, and the high level pulse counting means is disabled. At the end of the bit period the high level pulse count is compared to the low level pulse count. The comparison indicates whether the PWM signal was a "0" or a "1."

According to an embodiment, the frequency of the two oscillators can be SK times FS. It will be understood that SK is not necessarily an integer. Considerations for selecting SK or, alternatively labeling the oscillator frequency as "SRate," for selecting SRate, are described in greater detail at later sections. As illustration, SK can be 24, resulting in an SRate is 24×FS. It will be understood that the SK of 24 is only an example, not intended to limit the scope of any embodiments. Referring to the illustrative example that assumed if PWM bit is a "0" then, at ⅔ of the bit period after the starting high-to-low transition, the PWM signal has a low-to-high transition, the low level pulse counting means would have a count of approximately 16. Upon the transition to the PWM high level, the low level pulse counting means would be disabled, and the high level pulse counting means enabled. At the end of the bit period, the high level pulse counting means would have a count of approximately 8. A comparator could therefore readily decode the PWM signal as a "0." Likewise, if the PWM bit were "1" during the above-described example operations then, at the end of the bit period the respective outputs of the low pulse level counting means and the high pulse level counting means would, respectively, be reversed.

Regarding the frequency SRate of the two oscillators, in an aspect the value SK and, hence, SRate can be fixed at a value that can cover the full range of FS, i.e., the full range of PWM bit rates that the system is anticipated to receive. In this aspect the maximum PWM bit rate to be received determines the lower bound of the frequency. As will be understood by persons of ordinary skill in the art from this disclosure, if SRate is too low there may not be a sufficient difference between the ratio of the output of the low pulse level counting means to the output of the high pulse level counting means when the received PWM signal has a pulse width for a "0" bit as opposed to the ratio of these outputs when the PWM signal has a pulse width for a "1." On the other hand, as will also be understood by persons of ordinary skill in the art from this disclosure, if the SRate is too high a result may be unnecessary cost.

Figure 2:
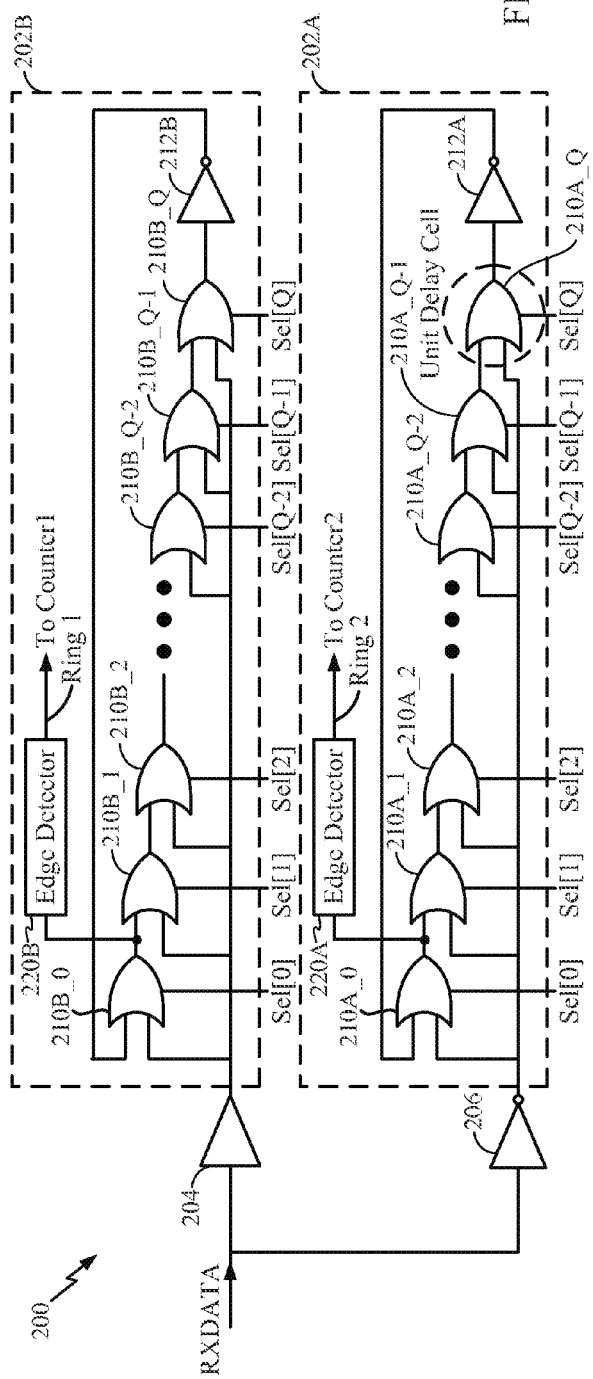
FIG. 2 is a schematic diagram of a PWM complementary enabled dual ring oscillator based PWM digitizer clock circuit of a digital PWM decoder system in accordance with an embodiment.

FIG. 2 is a schematic diagram of a PWM complementary enabled dual ring oscillator-based digitizer clock circuit 200 for a digital PWM decoder system in accordance with an embodiment.

Referring to FIG. 2, the PWM complementary enabled dual ring oscillator-based digitizer clock circuit 200 includes a first signal level gated ring oscillator 202A and a second, preferably physically identical, second signal level gated ring oscillator 202B. The first signal level gated ring oscillator 202A can be formed of unit delay cells 210A_0, 210A_1, 210A_2 . . . 210A_Q-2, 210A_Q-1, 210A_Q, forming a cascade of Q+1 unit delay cells (hereinafter collectively referenced as "unit delay cells" 210A and referenced, alternatively, in the generic singular as "unit delay cell 210A_j," where "j" can be any of 0 to Q). Each of the unit delay cells 210A can be OR gated by an inverted form of RXDATA, output from inverting buffer 206, which is assumed to be a PWM signal of a form shown, for example, at FIG. 1. An inverter 212A feeds the last unit delay cell 210A_Q-1 back to one input of the OR logic of the unit delay cell 210A_0. When the RXDATA is high, the output of the inverting buffer 206 is low, and all of the unit delay cells 210A are effectively enabled. This in turn enables the signal level gated ring oscillator 202A.

In an aspect, configurability for calibrating the first signal level gated ring oscillator 202A, and for digitizing PWM signals over a range of bit rates, can be provided by including in each unit delay cell 210A (or in each of a subset of unit delay cells 210A) a switchable delay feature, by which the unit delay cell 210A does, or does not impart the delay. The switchable delay feature can be controlled including, for each of such unit delay cells 210A, an individual select line, such as the example select lines Sel[0], Sel[1], Sel[2] . . . Sel[Q-2], Sel[Q-1], Sel[Q] (hereinafter collectively referenced as "select lines Sel" and, alternatively, in the generic singular as "select line Sel[j]," where "j" can be any of 0 to Q).

With continuing reference to FIG. 2, in the PWM complementary enabled dual ring oscillator-based digitizer clock circuit 200, the second signal level gated ring oscillator 202B can be and, in an aspect is preferably formed identical to the first signal level gated ring oscillator 202A. The example second signal level gated ring oscillator 202B is formed of a cascade of Q unit delay cells exemplified by 210B_0, 210B_1, 210B_2 . . . 210B_Q-2, 210B_Q-1, 210B_Q (hereinafter collectively referenced as "unit delay cells" 210B and referenced, alternatively, in the generic singular as "unit delay cell 210B_j," where "j" can be any of 0 to Q). An inverter 212B can feed back to one input of the OR logic of the unit delay cell 210B_0, to enable and disable its oscillation, based on the level of RXDATA.

As will be appreciated from this disclosure, relative polarity between the inverting buffer 206, the non-inverting buffer 204 and the polarity of RXDATA is arbitrary. The result is that one of the first signal level gated ring oscillator 202A and the second signal level gated ring oscillator 202B will be enabled when the PWM signal is at one of its two states (high or low), and the other of the first signal level gated ring oscillator 202A and the second signal level gated ring oscillator 202B will be enabled when the PWM signal is at the other of its two states.

Referring to FIG. 2, the PWM complementary enabled dual ring oscillator-based digitizer clock circuit 200 can include an edge detector 220A receiving an output from one of the unit delay elements 210A (in this example unit delay element 210A_0), performing edge detection and outputting a corresponding Ring2 signal. As will be described in reference to FIG. 4, the Ring2 signal can be the incrementing or counting clock of a counter incremented when RXDATA is high. The PWM complementary enabled dual ring oscillator-based digitizer clock circuit 200 can, likewise, include an edge detector 220B receiving an output from one of the unit delay elements 210B (in this example unit delay element 210B_0), performing edge detection and outputting a corresponding Ring1 signal. As will also be described in reference to FIG. 4, the Ring1 signal can be the incrementing or counting clock of a counter incremented when RXDATA is low.

It will be appreciated that, preferably, in aspects of the FIG. 2 PWM complementary enabled dual ring oscillator-based digitizer clock circuit 200 in which the unit delay cells 210A and 210B include a variable delay element, for example a voltage-controlled delay element, that the same Sel[j] signals control the same position in the respective cascade in which the unit delay cells 210A and 210B are arranged.

Figure 3:
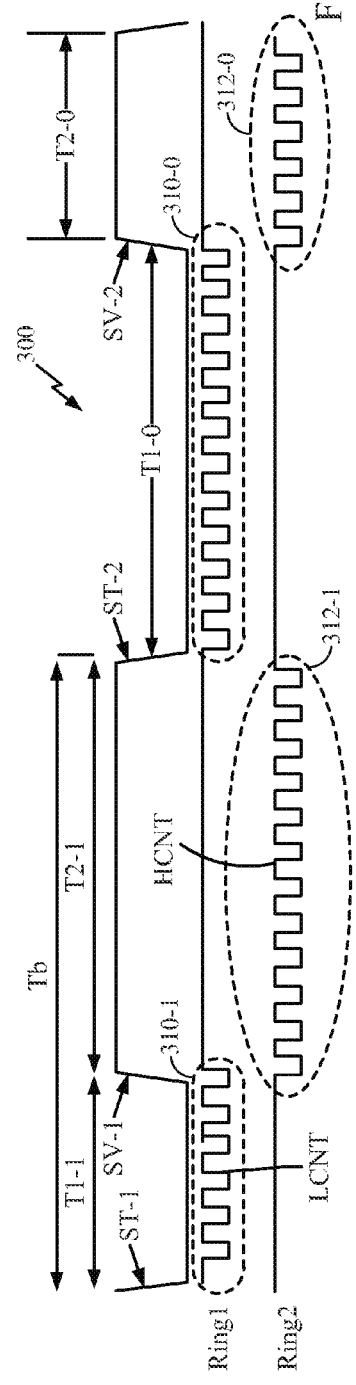
FIG. 3 is a timing diagram for inputs and outputs of the FIG. 2 dual ring oscillator based PWM digitizer clock circuit.

FIG. 3 shows an input-output timing diagram 300 for an example operation of the FIG. 2 PWM complementary enabled dual ring oscillator-based digitizer clock circuit 200, including its generated Ring1 and Ring2 clocks, in practicing one method according to various exemplary embodiments.

Referring to FIGS. 2 and 3 together, the RXDATA is a PWM signal having a period Tb. The portion of the bit period Tb from the bit start transition ST-1 to the bit start (or end) transition ST-2 represents a "1," having a timing of a low level of duration T1-1 and high level duration of T2-1. During T1-1 the FIG. 2 non-inverting buffer 204 outputs a "0" and, since the unit delay cells 210B are OR-gated, the second signal level gated ring oscillator 202B is enabled. The Ring1 output from the edge detector 220B continues for the duration T1-1. Referring to FIG. 3, on the Ring1 timeline there are, in this example, over the time region 310-1 a plurality of "LCNT" clock pulses. The number of leading edges of LCNT is approximately 6. At the end of T1-1 the RXDATA signal has a low-to-high transition SV-1. Referring to FIG. 2, the high level of RSDATA causes the non-inverting buffer 204 to output a "1," which disables the second signal level gated ring oscillator 202B and, at the same time, the inverting buffer 206 outputs a "0, which enables the first signal level gated ring oscillator 202A. The Ring2 output from the edge detector 220A continues for the duration T2-1 generating, referring to the FIG. 3 time region 312-1 a plurality of "HCNT" clock pulses. The number of leading edges of HCNT, in this example, is approximately 12, which is twice the example's number of leading edges of LCNT, i.e., approximately 6. It will be readily understood that the actual number of leading edges of LCNT and HCNT is a function of the frequency of the Ring1 and Ring2 signals. For example, if the frequency of the Ring1 and Ring2 signals were doubled, the number of leading edges of LCNT and HCNT would be 12 and 24, respectively.

Continuing to refer to FIG. 3, the bit period from the bit start transition ST-2 to the bit start (or end) transition SV-2 represents a "0." The time duration T1-0 at which RXDATA is low is, in this example, approximately twice the duration T1-1 for the preceding bit period. During T2-1 on the Ring1 timeline, over the time region 310-0, there are approximately 12 LCNT pulses. This is twice the number that occurred in the preceding corresponding time period 310-1. At the end of T1-0 the RXDATA signal has a low-to-high transition SV-2. Referring to FIG. 2, the high level of RSDATA causes the non-inverting buffer 204 to output a "1," which disables the second signal level gated ring oscillator 202B. Concurrently, the inverting buffer 206 outputs a "0, which enables the first signal level gated ring oscillator 202A. The Ring2 output from the edge detector 220A continues for the duration T2-0 generating, referring to the FIG. 3 time region 312-0, approximately 6 HCNT pulses, approximately one-half the number of HCNT pulses that occurred in the preceding corresponding time period 312-1 (when the RXDATA represented a "1").

Figure 4:
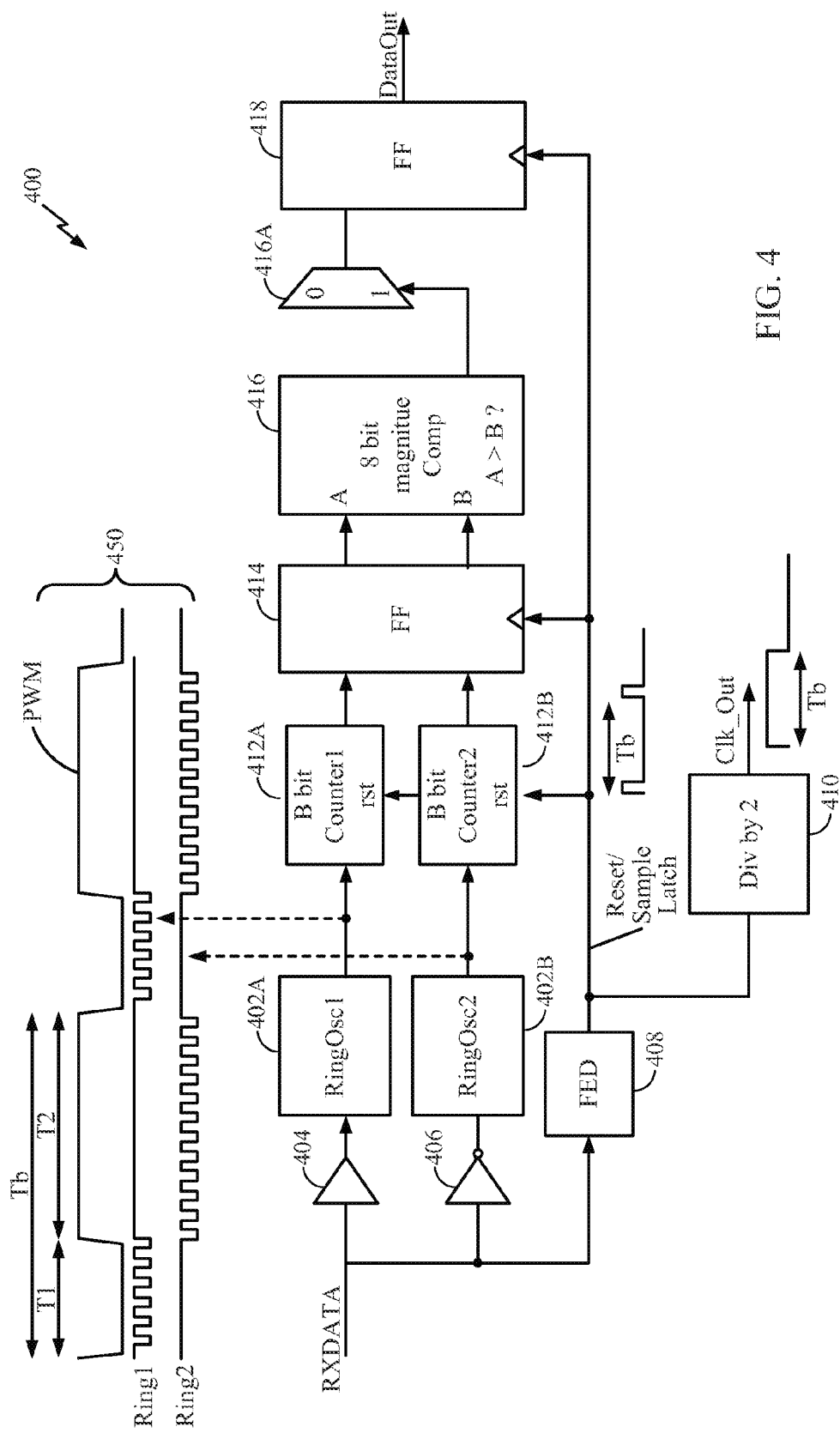
FIG. 4 is a high level schematic diagram of a dual ring oscillator-based PWM digitizer and digital PWM decoder circuit in accordance with an embodiment.

FIG. 4 is a high level schematic diagram of one PWM complementary enabled dual ring oscillator-based digitizer and digital PWM decoder system 400 in accordance with an embodiment.

Referring to FIG. 4, the PWM complementary enabled dual ring oscillator-based digitizer and digital PWM decoder system 400 can include a first PWM enabled ring oscillator 402A that, in an aspect, is configured to be enabled by RXDATA being low. In the FIG. 4 example, the first PWM enabled ring oscillator 402A is enabled through the non-inverting buffer 404, and disabled through that same non-inverting buffer 404 in response to the RXDATA being high. The first PWM enabled ring oscillator 402A can, according to one aspect, be implemented in accordance with the FIG. 2 first signal level gated ring oscillator 202A circuit. The PWM complementary enabled dual ring oscillator digitizer and digital PWM decoder system 400 can, in a related aspect, include a second PWM enabled ring oscillator 402B configured to be enabled by RXDATA being high, for example through the inverting buffer 406 and disabled, for example through that same inverting buffer 406, in response to the RXDATA being low. The second PWM enabled ring oscillator 402B can, according to one aspect, be implemented in accordance with the FIG. 2, second signal level gated ring oscillator 202B circuit.

It will be understood that, although not shown, in an aspect each of the first PWM enabled ring oscillator 402A and the second PWM enabled ring oscillator 402B can include a frequency selection or adjustment feature (not shown), such as the select line Sel controlled variable delay feature described in reference to FIG. 2.

Referring to FIG. 4, the PWM complementary enabled dual ring oscillator-based digitizer and digital PWM decoder system 400 can include a first digital counter, for example the first 8-bit counter 412A, and a second digital counter, for example the second 8-bit counter 412B. The first 8-bit counter can receive the Ring1 clock from the first PWM enabled ring oscillator 402A, and the second 8-bit counter 412B can receive the Ring2 clock from the second PWM enabled ring oscillator 402B. It will be understood that 8 bits is only one example of a counter bit size and is not intended to limit the scope of any of the exemplary embodiments. For example, the first 8-bit counter 412A and second 8-bit counter 412B can be readily replaced by a 4-bit, 5-bit or, for example, 12-bit counter. Persons of ordinary skill in the art, based on this disclosure and a provided specification of PWM signals to be received, can readily identify a bit size of counters to use for the functions performed by the first and second 8-bit counters 412A and 412B.

Referring still to FIG. 4, in an aspect the first 8-bit counter 412A and the second 8-bit digital counter 412B can be configured with an RST input, and corresponding internal circuitry to reset in response to the falling edge of the RXDATA signal. The reset can, for example, be to "00000000." In the FIG. 4 PWM complementary enabled dual ring oscillator-based digitizer and digital PWM decoder system 400, a falling edge detector (FED) 408 can perform the edge detecting, and can generate a corresponding RESET/SAMPLE LATCH signal. The RESET/SAMPLE LATCH signal controls the described reset of the first and second 8-bit counters 412A, 412B, and can serve as the sample latch clock input to a digitized pulse width latch or flip-flop (FF) 414, described below. The RESET/SAMPLE LATCH signals has the RXDATA PWM bit period Tb as shown at FIG. 3. In an aspect, a divide-by-2 circuit 410 can receive the RESET/SAMPLE LATCH signals and generate a corresponding Clk_Out as shown.

With continuing reference to FIG. 4, the PWM complementary enabled dual ring oscillator-based digitizer and digital PWM decoder system 400 can include a digitized pulse width latch or FF 414. The digitized pulse width FF 414 can be configured to receive, as latch data inputs, the 8-bit outputs of the first and second 8-bit counters 412A, 412B and, as described above, to receive as its latch clock the same RESET/SAMPLE LATCH signal that resets the first and second 8-bit counters 412A and 412B. In an aspect, the outputs of the digitized pulse width FF 414 can feed an "A" and a "B" input of a digital comparator 416 that generates a binary comparison result (not explicitly shown) that is either directly (not shown) output from the digital comparator 416 to the decoded data output FF 418 or, in one alternative, is generated by controlling a mux 416A configured to select between a "0" and "1" for output to the decoded data output FF 418. The decoded data output from the FF 418 is labeled "DataOut."

Referring still to FIG. 4, timing diagram 450 can be in accordance with the FIG. 3 input-output timing diagram 300.

Figure 5:
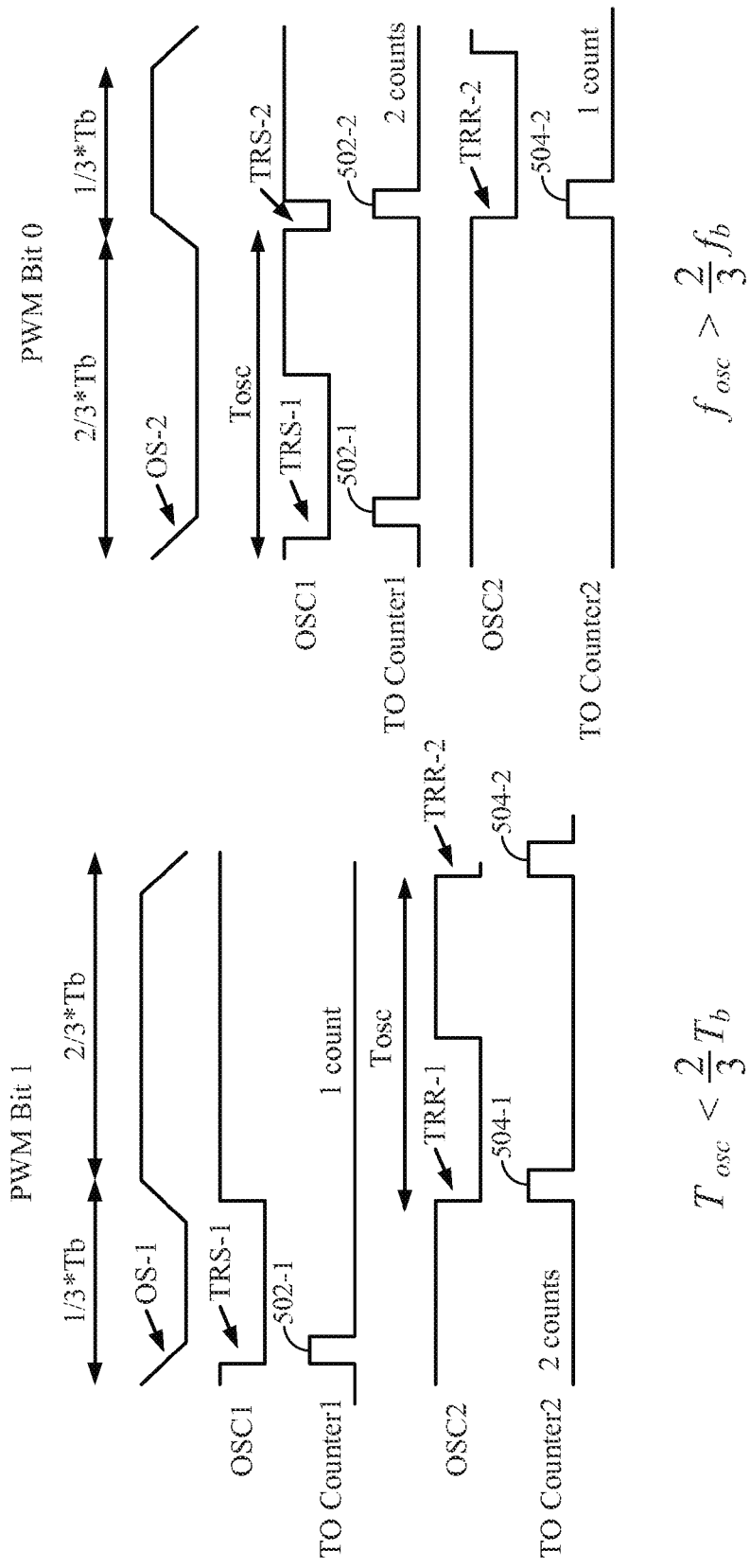
FIGS. 5A and 5B show a timing diagram relating to a PWM bit of value "1" and a PWM bit of value "0," respectively, in determining a minimum oscillating frequency of ring oscillators in a dual ring oscillator PWM digitizer in accordance with an embodiment.

FIGS. 5A and 5B show a timing diagram relating to a PWM bit of value "1" and a PWM bit of value "0," respectively, in determining a minimum oscillating frequency of ring oscillators in a dual ring oscillator PWM digitizer in a digital PWM decoder circuit in accordance with one or more exemplary embodiments.

Referring to FIG. 5A, assuming a bit period of Tb, an example PWM representation of "1" is shown as the signal having a high-low transition OS-1 at the start of the bit period, and continuing at the low value for a duration of ⅓ Tb, at which time the signal transitions from low to high and maintains this for the remaining ⅔ Tb. The example assumes the oscillator frequency f osc is 3/2 of the bit rate f b. The ring oscillator that is enabled when the PWM signal is low (e.g., the FIG. 2 second signal-level enabled ring oscillator 202B), by being enabled for ⅓ Tb, is enabled for one high-low transition, labeled TRS-1. In response, the falling edge detector (e.g., FIG. 2, edge detector 220B) generates a single PWM pulse low digitizing clock pulse, labeled 502-1 (e.g., one pulse of the FIG. 2 Ring1). Continuing with this example, at this value of f osc, i.e., 3/2 the bit rate f b the ring oscillator that is enabled when the PWM signal is high (e.g., the FIG. 2 first signal-level enabled ring oscillator 202A), by being enabled for last ⅔ Tb, is enabled for two high-low transitions, labeled TRR-1 and TRR-2. In response, the falling edge detector (e.g., FIG. 2, edge detector 220B) generates two signal PWM pulse high digitizing clock pulses, labeled 504-1 and 504-2 (e.g., two pulses of the FIG. 2 Ring2).

Referring to FIG. 5B, keeping the above assumption of f osc being 3/2 of the bit rate f b, but the PWM representing a "0," the PWM signal has a high-low transition OS-2 at the start of the bit period, and continues at the low value for a duration of ⅔ Tb. At the ⅔ Tb point the PWM signal transitions from low to high and maintains the high level for the remaining ⅓ Tb. At this value of f osc being 3/2 f b, the ring oscillator that is enabled when the PWM signal is low (e.g., the FIG. 2 second signal-level enabled ring oscillator 202B), by being enabled for ⅔ Tb is enabled for two high-low transitions, labeled TRS-1 and TRS-2. In response, the falling edge detector (e.g., FIG. 2, edge detector 220B) generates a two PWM pulse low digitizing clock pulses, labeled 502-1 and 502-2 (e.g., two pulses of the FIG. 2 Ring1). Continuing with this example, the ring oscillator that is enabled when the PWM signal is high (e.g., the FIG. 2 first signal-level enabled ring oscillator 202A), being enabled only for the last ⅓ Tb, is enabled for only one high-low transition, which replicates the FIG. 5A TRR-2. In response, the falling edge detector (e.g., FIG. 2, edge detector 220B) generates only one PWM pulse high digitizing clock pulse, which replicates the FIG. 5A pulse 504-2 labeled 504-2 (e.g., only pulses of the FIG. 2 Ring2).

It will be readily appreciated by persons of ordinary skill in the art that if f osc is equal to or greater than 3/2 f b the PWM signal can be decoded; referring to FIG. 2, if the bit is a "1" there will be two Ring1 pulses and only one Ring2 pulse, while of the bit is a "0" there will be the opposite, one Ring1 pulse and two Ring2 pulses. However, as will also be appreciated by such persons from this disclosure, if f osc falls below 3/2 f b the Ring1 and Ring2 pulses may no longer be decodable.

Methods and systems in accordance with one exemplary embodiment can include a calibration feature, for example, to calibrate the FIG. 4 to a frequency that will remain within acceptable limits over all worst points in the anticipated range of power-voltage-temperature (PVT) in which the method or system will be operated.

Figure 6:
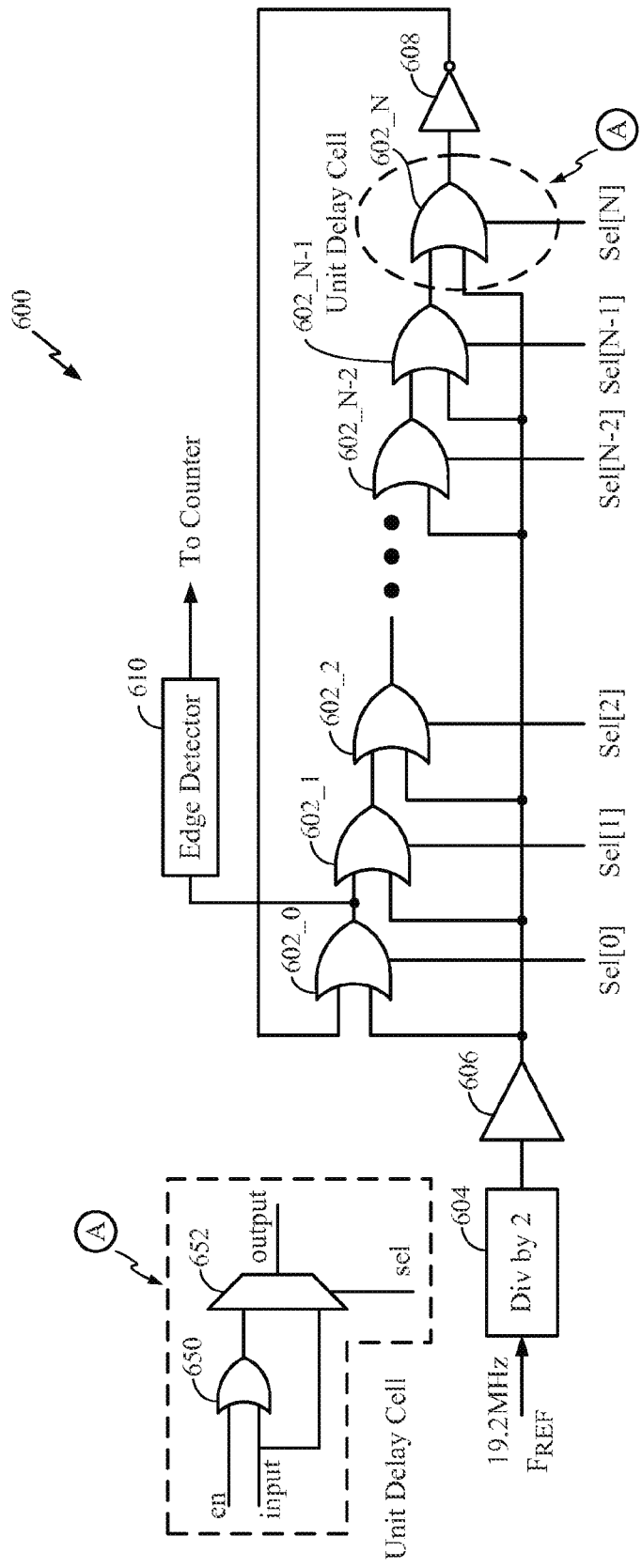
FIG. 6 is a simplified schematic diagram of one PWM complementary enabled dual ring oscillator digitizer clock circuit, and an example calibration feature, for a digital PWM decoder system in accordance with an embodiment.

FIG. 6 is a simplified schematic diagram of ring oscillator-based digitizer clock circuit 600, showing an example calibration feature, for use in a digital PWM decoder system in accordance with one or more exemplary embodiments. Example operations in calibration methods according to exemplary embodiments will be described.

Referring to FIG. 6, the example ring oscillator-based digitizer clock circuit 600 can include a cascade of N+1 unit delay cells 602_0, 602_1, 602_2 . . . 602_N–2, 602_N–1, 602_N (hereinafter collectively referenced as "unit delay cells 602" and referenced, alternatively, in the generic singular as "unit delay cell 602_$k$," where "k" can be any of 0 to N). Select lines Sel[0], Sel[1], Sel[2] . . . Sel[N–2], Sel[N–1], Sel[N] (hereinafter collectively referenced as "select lines Sel" and referenced, alternatively, in the generic singular as "select line Sel[k]," where "k" can be any of 0 to N) can be provided, with each unit delay cell 602_$k$ having a corresponding select line Sel[k]. Drawing region "A" shows an expanded view of the last unit delay cell 602_N, which can be representative of the remaining unit delay cells 602. As shown, the unit delay cells 602 can be implemented as a two-input logical OR gate 650, with one of the two inputs functioning as an enable, labeled "en," and the other, labeled "input," receiving the output of a preceding unit delay cell or, for the first unit delay cell 602_0, the feedback output of the last unit delay cell 602_N.

An Edge Detector 610 detects each falling edge of the output of the first unit delay cell 602_0 and outputs this as a digitizing count clock. The digitizing count clock couples to either a counter that is incremented when the PWM signal is high or to a counter that is incremented when the PWM signal is low, as described in reference to the examples shown at FIGS. 2 and 4.

Depending on the specific technology in which the ring oscillator-based digitizer clock circuit 600 operates, there can be variation in its frequency across various process-voltage-temperature (PVT) points. Referring to FIG. 6, various exemplary embodiments provide, among other features, a novel, but structurally simple, oscillator frequency calibration logic to mitigate PVT variation. In one example process, the reference clock of frequency Fref is divided by 2 by the divide-by-2 device 604, to generate an output that forms a fixed 50 percent duty cycle simulation of a non-modulated PWM signal. Since the simulated signal drive buffer 606 is non-inverting, the unit delay cells 602 will be enabled while the divide-by-2 reference signal is low, and disabled when it is high. One process can include starting by enabling all of the unit delay cells 602. As readily appreciated, this results in the lowest oscillation frequency. At each falling edge (not shown) of the divide-by-2 reference signal the counter (not shown in FIG. 6) to which the falling edge detector 610 output is coupled is sampled. In an aspect, there is a pre-calculated target count. At the lowest oscillator frequency the sampled count will be the lowest, likely significantly lower than the target count. Next, according to one aspect, a unit delay cell 602_$k$ can be removed from the ring by switching the value of its corresponding select line Sel[k]. The removal process can continue until the count, sampled at the falling edge of the divide-by-2 reference clock, is equal to or bigger than the target count. In one aspect, the selection setting of Sel[k], for k=0 to N, can be recorded and set to both ring oscillators in the decoder. This process can be repeated over PVT curves to obtain the selection settings of Sel[k], k=0 to N, at which the oscillator frequency meets the minimum requirement over the worst case PVT.

Figure 7:
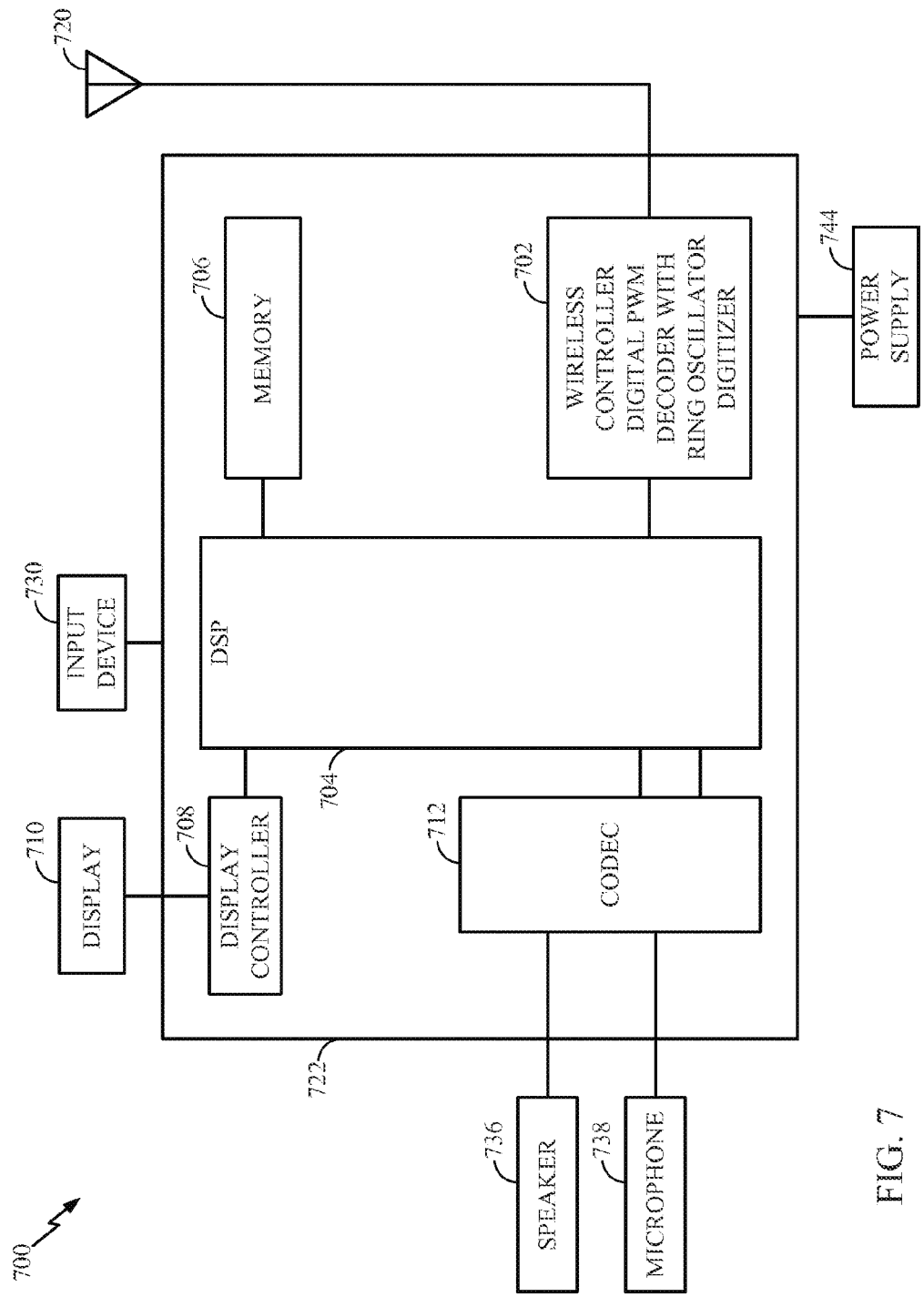
FIG. 7 is a functional block diagram of one example personal computing device according to an embodiment.

FIG. 7 is a functional block diagram of an electronic device 700, such as a wireless phone according to one or more exemplary embodiments. The device 700 may include a probabilistic program multi-level, e.g., wireless controller and oscillator based digitizer and digital PWM decoder circuit 702 and a memory 706 coupled to a processor or processing unit such as a digital signal processor (DSP) 704. In one illustrative example, the wireless controller and oscillator based digitizer and digital PWM decoder 702 may include the FIG. 2 differentially enabled dual ring oscillator or the FIG. 4 ring oscillator-digitized PWM and digital PWM decoder system, or any combination thereof.

Referring still to FIG. 7, the electronic device 700 may have a display controller 708 coupled to the DSP 704 and to a display 710. In addition, a coder/decoder (CODEC) 712 may be coupled to the DSP 704, and to a speaker 736 and a microphone 738. The wireless controller and oscillator based digitizer and digital PWM decoder 702 may be coupled to a wireless antenna 720. In a particular embodiment, the DSP 704, memory 706, the display controller 708, wireless controller and oscillator based digitizer and digital PWM decoder 702, and the CODEC 712 are included in a system-in-package or system-on-chip (SOC) 722. In a particular embodiment, an input device 730 (e.g., touchpad, keypad, other human command interface) and a power supply 744 are coupled to the SOC 722. Moreover, as illustrated in FIG. 7, in one aspect the display 710, the input device 730, the speaker 736, the microphone 738, the wireless antenna 720, and the power supply 744 may be external to the SOC 722. However, each may be coupled to one or more components of the SOC 722, for example through an interface or a controller (not shown).

Figure 8:
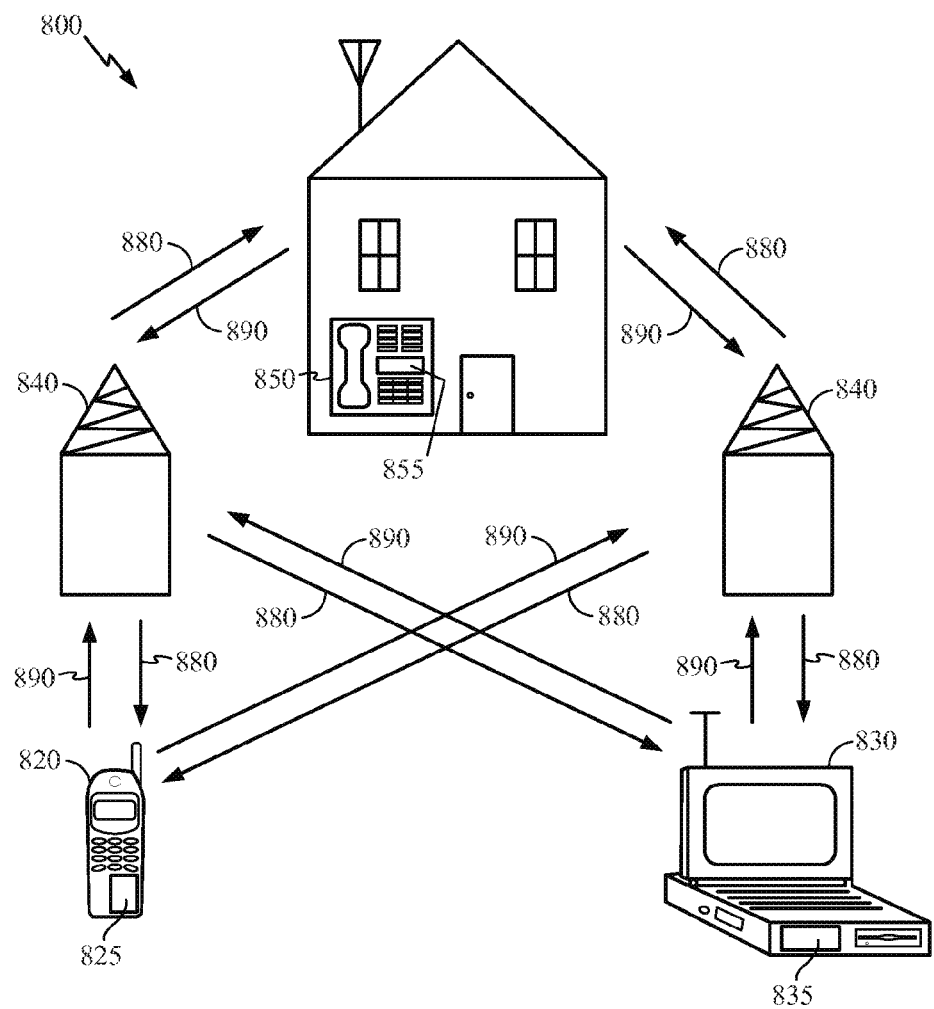
FIG. 8 is a functional block diagram of example personal computing devices according to an embodiment.

FIG. 8 illustrates an exemplary wireless communication system 800 in which one or more embodiments of the disclosure may be advantageously employed. For purposes of illustration, FIG. 8 shows three remote units 820, 830, and 850 and two base stations 840. It will be recognized that conventional wireless communication systems may have many more remote units and base stations. The remote units 820, 830, and 850 include integrated circuit or other semiconductor devices 825, 835 and 855 (including on-chip voltage regulators, as disclosed herein), which are among embodiments of the disclosure as discussed further below. FIG. 8 shows forward link signals 880 from the base stations 840 and the remote units 820, 830, and 850 and reverse link signals 890 from the remote units 820, 830, and 850 to the base stations 840.

In FIG. 8, the remote unit 820 is shown as a mobile telephone, the remote unit 830 is shown as a portable computer, and the remote unit 850 is shown as a fixed location remote unit in a wireless local loop system. For example, the remote units may be any one or combination of a mobile phone, hand-held personal communication system (PCS) unit, portable data unit such as a personal data assistant (PDA), navigation device (such as GPS enabled devices), set top box, music player, video player, entertainment unit, fixed location data unit such as meter reading equipment, or any other device that stores or retrieves data or computer instructions, or any combination thereof. Although FIG. 8 illustrates remote units according to the teachings of the disclosure, the disclosure is not limited to these exemplary illustrated units. Embodiments of the disclosure may be suitably employed in any device that includes active integrated circuitry including memory and on-chip circuitry for test and characterization.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for digitizing and decoding a PWM signal. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A method for decoding a pulse width modulated signal, comprising:
over a time interval of the pulse width modulated signal, said time interval having a start and an end, incrementing a first count when the pulse width modulated signal is at a first level;
over said time interval, incrementing a second count when the pulse width modulated signal is at a second level; and
at the end of said time interval comparing the first count to the second count and generating, based on the comparing, a decoded bit.

2. The method for decoding a pulse width modulated signal of claim 1, wherein incrementing the first count is based on a first incrementing clock and incrementing the second count is based on a second incrementing clock.

3. The method for decoding a pulse width modulated signal of claim 1, wherein incrementing the first count includes enabling a first incrementing clock to a first counter only when the pulse width modulated signal is at the first level, and wherein incrementing the second count includes enabling a second incrementing clock to a second counter only when the pulse width modulated signal is at the second level.

4. The method of claim 1 wherein incrementing the first count includes:
changing a first oscillator from a non-oscillating state to an oscillating state in response to the PWM signal being at the first level;
generating a first incrementing clock based on the first oscillator in the oscillating state; and
incrementing a first counter based on the first incrementing clock.

5. The method for decoding a pulse width modulated signal of claim 4, wherein changing the first oscillator from the non-oscillating state to the oscillating state includes coupling an enabling signal to a ring oscillator in response to the pulse width modulated signal being at the first level.

6. The method for decoding a pulse width modulated signal of claim 4, wherein the first oscillator is a gated ring oscillator having a feedback gate, and wherein changing the first oscillator from the non-oscillating state to the oscillating state includes coupling the pulse width modulated signal to an input of the feedback gate.

7. The method for decoding a pulse width modulated signal of claim 1, wherein said time interval is a bit period of the pulse width modulated signal, wherein the method further comprises detecting a beginning of the bit period and, in response, resetting a first counter generating the first count and a second counter generating the second count.

8. The method for decoding a pulse width modulated signal of claim 7, wherein incrementing the first count includes incrementing the first counter, and incrementing the second count includes incrementing the second counter.

9. The method for decoding a pulse width modulated signal of claim 8, wherein the method further comprises detecting an end of the bit period and, in response, latching an output of the first counter and of the second counter.

10. The method for decoding a pulse width modulated signal of claim 9, further comprising, in response to detecting the end of the bit period, resetting the first counter and resetting the second counter.

11. The method for decoding a pulse width modulated signal of claim 7
wherein incrementing the first count includes:
changing a first oscillator from a non-oscillating state to an oscillating state in response to the pulse width modulated signal being at the first level;
generating a first incrementing clock based on the first oscillator in the oscillating state; and
incrementing the first counter based on the first incrementing clock.

12. The method for decoding a pulse width modulated signal of claim 11, wherein the first oscillator is a ring oscillator and wherein changing from the non-oscillating state to the oscillating state includes coupling an enabling signal to said ring oscillator in response to the pulse width modulated signal being at the first level.

13. The method for decoding a pulse width modulated signal of claim 11, wherein the first oscillator is a gated ring oscillator having a feedback gate, and wherein changing the first oscillator from the non-oscillating state to the oscillating state includes coupling the pulse width modulated signal to an input of the feedback gate.

14. The method for decoding a pulse width modulated signal of claim 13, further comprising changing an oscillating frequency of the first oscillator by switching the feedback gate from a first state to a second state, wherein the first state imparts a unit delay and the second state does not impart the unit delay.

15. An apparatus for decoding a pulse width modulated signal, comprising:
a first ring oscillator configured to oscillate in response to a first state of the pulse width modulated signal;
a second ring oscillator configured to oscillate in response to a second state of the pulse width modulated signal;
a first counter coupled to the first ring oscillator;
a second counter coupled to the second ring oscillator; and
a comparator configured to compare the first counter to the second counter and output a resulting bit.

16. The apparatus for decoding a pulse width modulated signal of claim 15, wherein the first ring oscillator is a gated ring oscillator having a feedback gate having an enabling input configured to receive an inverted form of the pulse width modulated signal, and wherein the second ring oscillator is a gated ring oscillator having a feedback gate having an enabling input configured to receive a non-inverted form of the pulse width modulated signal.

17. The apparatus for decoding a pulse width modulated signal of claim 15, further comprising a pulse width modulated period start detector configured to generate a reset signal indicating a detecting of the pulse width modulated period start, wherein the first counter is configured to reset in response to the reset signal.

18. The apparatus for decoding a pulse width modulated signal of claim 15, wherein the apparatus for decoding a pulse width modulated signal is integrated in at least one semiconductor die.

19. The, apparatus for decoding a pulse width modulated signal of claim 18, further comprising a device, selected from the group consisting of a set top box, music player, video player, entertainment unit, navigation device, communication device, personal digital assistant (PDA), fixed location data unit, and a computer, into which the apparatus for decoding a pulse width modulated signal is integrated.

20. An apparatus for decoding a pulse width modulated signal, comprising:
means for incrementing, over a time interval of the pulse width modulated signal, the time interval having a beginning and an end, a first count when the pulse width modulated signal is at a first level;
means for incrementing, over said time interval, a second count when the pulse width modulated signal is at a second level;
means for comparing the first count to the second count at the end of said time interval and generating, based on the comparing, a decoded bit.

21. The apparatus for decoding a pulse width modulated signal of claim 20, wherein said time interval is a bit period of the pulse width modulated signal, wherein the apparatus further comprises means for detecting a beginning of the bit period and, in response, resetting the first count and the second count.

22. The apparatus for decoding a pulse width modulated signal of claim 20, wherein the apparatus for decoding a pulse width modulated signal is integrated in at least one semiconductor die.

23. The, apparatus for decoding a pulse width modulated signal of claim 20, further comprising a device, selected from the group consisting of a set top box, music player, video player, entertainment unit, navigation device, communication device, personal digital assistant (PDA), fixed location data unit, and a computer, into which the apparatus for decoding a pulse width modulated signal is integrated.

* * * * *